United States Patent
Cantacuzene et al.

(10) Patent No.: US 6,623,802 B1
(45) Date of Patent: *Sep. 23, 2003

(54) PROCESS AND INSTALLATION FOR FORMING A LAYER ON A SUBSTRATE

(75) Inventors: Serban Cantacuzene, Massy (FR); Thierry Sindzingre, Cachan (FR)

(73) Assignee: L'Air Liquide Societe Anonyme a Directoire et Conseil de Surveillance pour l'Etude l'Exploitation des Procedes Georges Claude, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 09/890,938
(22) PCT Filed: Jan. 10, 2000
(86) PCT No.: PCT/FR00/00033
§ 371 (c)(1),
(2), (4) Date: Aug. 7, 2001
(87) PCT Pub. No.: WO00/47798
PCT Pub. Date: Aug. 17, 2000

(30) Foreign Application Priority Data

Feb. 11, 1999 (FR) .............................. 99 01638

(51) Int. Cl.$^7$ .................. C23C 16/40; C23C 16/509
(52) U.S. Cl. ................. 427/255.29; 427/255.31; 427/576; 427/578; 118/719; 118/723 ER

(58) Field of Search .................. 427/563, 576, 427/578, 579, 585, 255.31, 255.29, 255.7; 118/718, 719, 723 ER, 729

(56) References Cited

U.S. PATENT DOCUMENTS

| | | | |
|---|---|---|---|
| 5,401,305 A | | 3/1995 | Russo et al. |
| 5,685,949 A | * | 11/1997 | Yashima .................. 156/643.1 |
| 5,807,614 A | * | 9/1998 | Sindzingre et al. ......... 427/540 |
| 5,807,615 A | * | 9/1998 | Sindzingre et al. ......... 427/562 |

FOREIGN PATENT DOCUMENTS

EP    0 725 163 A2    7/1996

* cited by examiner

Primary Examiner—Bret Chen
(74) Attorney, Agent, or Firm—Burns, Doane, Swecker & Mathis, L.L.P.

(57) ABSTRACT

A method and installation for forming a coating on a substrate, wherein the substrate is contacted with a gas treatment atmosphere in order to carry out said coating. The gas treatment atmosphere includes a primary gas treatment mixture comprising excited or unstable gaseous species obtained from a device which converts an initial gas mixture into said species, and an adjacent gas treatment mixture comprising at least one gas precursor required to form said coating, whereby the adjacent mixture is not transported via said device. The adjacent gas treatment mixture is injected into the flow of the primary gas mixture when the gas exits from the device.

26 Claims, 2 Drawing Sheets

PROCESS AND INSTALLATION FOR FORMING A LAYER ON A SUBSTRATE

BACKGROUND OF THE INVENTION

1. Field of the Invention

The invention relates to the field of surface treatments of substrates, whether these are metallic or non-metallic, such as, polymer, textile, paper, glass, or even wood, plaster or tile substrates, and whether these substrates are flat or are in the form of a volume, these substrates being used in extremely varied fields including metallurgy, bottle-making, flat glass, plastic packaging, etc.

2. Description of the Related Art

It is known that these surface treatments are usually carried out for the purpose of improving the adherability and wettability of these substrates, or else for introducing a friction coefficient, corrosion resistance, color, an optical index, etc.

Among the very numerous methods available in the literature for carrying out these surface treatments are liquid-phase treatments, low-pressure plasma treatments, corona-discharge treatments or flame brushing.

The Applicant has recently proposed, in documents EP-A-734 461 and EP-A-734 462, a process for depositing silicon-based layers on a substrate, in which process the substrate is placed in the remote-plasma position of an apparatus for forming excited or unstable gaseous species so as to be brought into contact with a gaseous treatment atmosphere necessary for producing the coating, obtained from the following two components:

- a primary gas treatment mixture, as obtained at the gas outlet of the apparatus, which comprises excited or unstable gaseous species resulting from the transformation in the apparatus of an initial gas mixture; and
- an adjacent gas treatment mixture which comprises a gaseous silicon precursor and which has not passed through the apparatus in question.

These European documents, together with document FR-A-2 692 730 also in the name of the Applicant, disclose a device for forming excited or unstable gaseous species, operating approximately at atmospheric pressure, and suitable for implementing the process described in the above-mentioned European documents.

Although these processes undoubtedly constitute an advance over the existing techniques (liquid phase, flame brushing, low-pressure plasma, etc.), the Applicant has shown by its studies that there may be further improved, especially so as to increase the transformation efficiency of the reactive gas (for example silane) and to reduce the production of undesirable particles (powders).

Specifically, an insufficient transformation efficiency of the reactive gases correspondingly limits the rate of growth of the layer deposited and therefore the productivity and economic benefit of the process.

SUMMARY OF THE INVENTION

It is one of the objectives of the present invention to provide a solution to the abovementioned technical problems.

To do this, the invention relates to a process for forming a coating on a substrate, in which the following steps are carried out:

- at least one apparatus for forming excited or unstable gaseous species is used, in which an initial gas treatment mixture is transformed so as to obtain, at the gas outlet of the apparatus, a primary gas treatment mixture which comprises excited or unstable gaseous species and which is substantially free of electrically charged species;
- the substrate is brought into contact, at a pressure close to atmospheric pressure, with a gaseous treatment atmosphere in order to deposit the coating, this atmosphere being obtained from the primary gas mixture and an adjacent gas treatment mixture which comprises at least one gaseous precursor needed to form the desired coating, and which has not passed through the said apparatus;
- the process being characterized in that the adjacent gas mixture is injected into the stream of primary gas mixture as obtained at the gas outlet of the apparatus.

The process according to the invention may moreover have one or more of the following technical characteristics:

- the injection of the adjacent gas mixture into the stream of primary gas mixture is made in the following manner:
  i) means are used for separating the stream of primary gas treatment mixture, as obtained at the gas outlet of the apparatus, into at least two separate streams;
  j) the injection of adjacent gas mixture is made to enter between said at least two separate streams of primary mixture;
- the residual oxygen content of the gaseous treatment atmosphere is less than 500 ppm and preferably between 5 and 100 ppm;
- the dew point of the gaseous treatment atmosphere is less than −20° C. and preferably less than −30° C.;
- throughout or during part of the time the substrate is in contact with the gaseous treatment atmosphere, the substrate is at a temperature of between 50 and 350° C., and more preferably between 100 and 300° C. (whether the substrate undergoes heating during the contact or else, for example, whether it reaches the contact zone already hot);
- the treated substrate is brought opposite the gas outlet of said apparatus, where appropriate opposite the gas outlets of several apparatuses placed in parallel over the width of the substrate and/or successively opposite the gas outlets of several apparatuses placed in series, by a conveying system passing through an internal space bounded by a shrouding assembly isolated from the surrounding atmosphere, the assembly being connected in a sealed manner to the apparatus or including the apparatus;
- the nature of the coating produced on the substrates belongs to one of the following categories: a metal oxide or a metal oxynitride;
- the coating produced is a coating comprising silicon and the adjacent gas treatment mixture therefore includes at least one gaseous silicon precursor;
- at least one of said apparatuses, in which the initial gas treatment mixture is transformed, is the site of an electrical discharge created between a first electrode and a second electrode which extend in an elongated main direction, the initial gas mixture passing through the discharge transversely to the electrodes and to this main direction; and
- a layer of a dielectric material is placed on the surface of at least one of the electrodes, opposite the other electrode.

The invention also relates to an installation for forming a coating on a substrate, suitable especially for implementing the process described above, and comprising:

at least one apparatus for forming excited or unstable gaseous species, which is capable of transforming an initial gas treatment mixture so as to obtain, at the gas outlet of the apparatus, a primary gas treatment mixture which comprises excited or unstable gaseous species and which is substantially free of electrically charged species;

means for feeding an adjacent gas treatment mixture, comprising at least one gaseous precursor needed to form the coating, which does not pass through the apparatus, and is capable of forming, with the primary gas treatment mixture as obtained at the gas outlet of the apparatus, a gaseous treatment atmosphere to be brought into contact, at a pressure close to atmospheric pressure, with the substrate in order to produce the coating;

the installation being characterized in that said means for feeding the adjacent gas mixture allow it to be injected into the stream of primary gas mixture as obtained at the gas outlet of the apparatus.

According to one of the embodiments of the installation according to the invention, the means for feeding the adjacent gas mixture into the stream of primary gas mixture comprise:

i) means for separating the stream of primary gas mixture as obtained at the gas outlet of the apparatus into at least two separate gas streams;

j) means for injecting the adjacent gas mixture between said at least two separate streams of primary gas mixture.

BRIEF DESCRIPTION OF THE FIGURES OF THE DRAWINGS

Further features and advantages will become apparent from the following description, given solely by way of illustration and with reference to the appended drawings in which.

DETAILED DESCRIPTION OF THE PREFERRED EMBODIMENTS

Figure 1A:
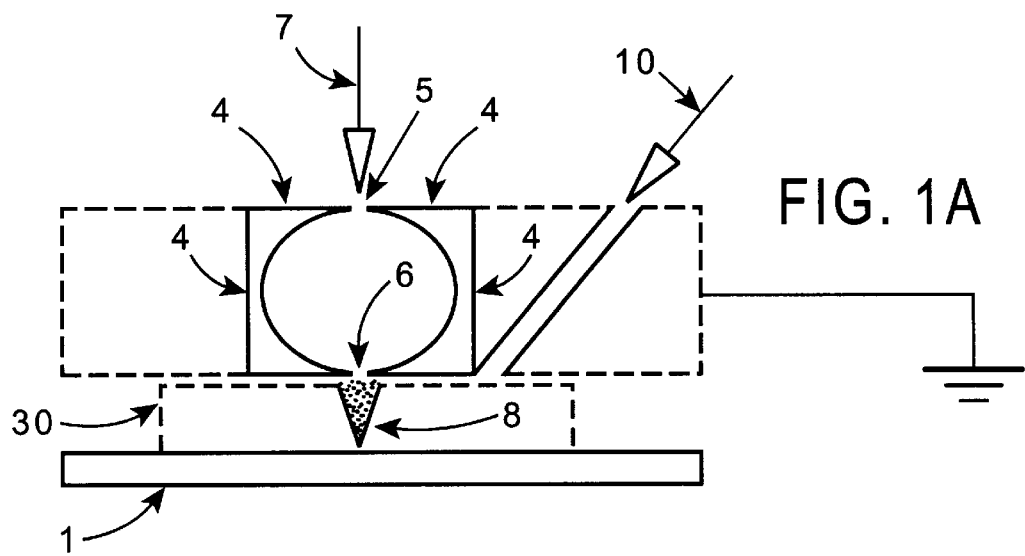
FIGS. 1A and 1B are schematic representations of an installation for forming a coating on a substrate according to the prior art.
Figure 1B:
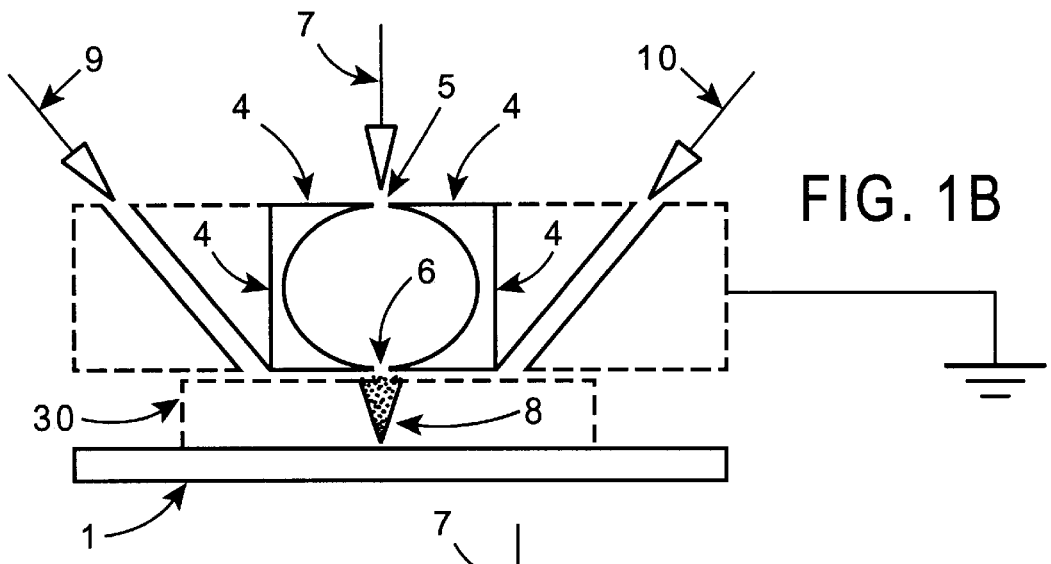

FIGS. 1A and 1B therefore provide partial schematic representations of a coating installation according to the abovementioned prior art (European documents).

Shown schematically in FIG. 1 by the reference 4 is an apparatus for forming excited or unstable gaseous species, supplied at its gas inlet 5 with an initial gas treatment mixture 7. A primary gas treatment mixture 8 is then obtained at the gas outlet 6 of the apparatus.

Moreover, a substrate 1, placed opposite this gas outlet 6, is exposed to an adjacent gas treatment mixture which is fed, in the embodiments shown, via one or two gas inlets (10 in the case of FIG. 1A and 9 and 10 in the case of FIG. 1B), this adjacent treatment mixture not passing through the apparatus 4 for forming excited or unstable gaseous species.

Shown symbolically in these figures by the dashed rectangle 30 is the zone in which the primary and adjacent gas treatment mixtures interact so as to produce the required coating on the substrate 1.

Figure 2:
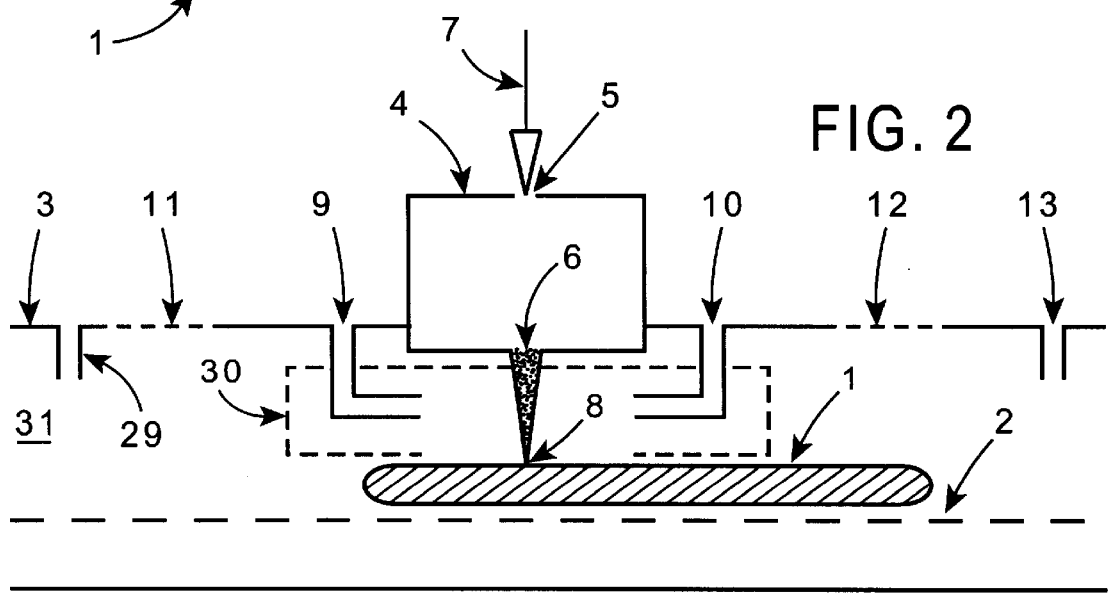
FIG. 2 is a schematic representation of one embodiment according to the prior art, such as one comprising a tunnel.

FIG. 2 shows one particular embodiment of a coating installation according to the prior art already mentioned, such as comprising a tunnel 3 defining an internal space 31 through which the substrate 1 is conveyed with the aid of a conveying means 2 (for example a conveyor belt).

The substrate is then brought opposite the gas outlet 6 of the apparatus 4 mentioned above within the context of FIGS. 1A and 1B, where it comes into contact with the primary gas treatment mixture 8 and with the adjacent treatment mixture being fed via the two gas inlets 9 and 10.

It will be noted that the embodiment shown in FIG. 2 allows the substrate 1 to be treated by several apparatuses for forming excited or unstable gaseous species placed in series, the apparatuses placed at 11 and 12 not having been shown in order not to unnecessarily clutter up the figure, while the reference numbers 13 and 29 for their part illustrate additional examples of inlets of adjacent treatment mixtures that have not passed through the apparatuses.

Figure 3:
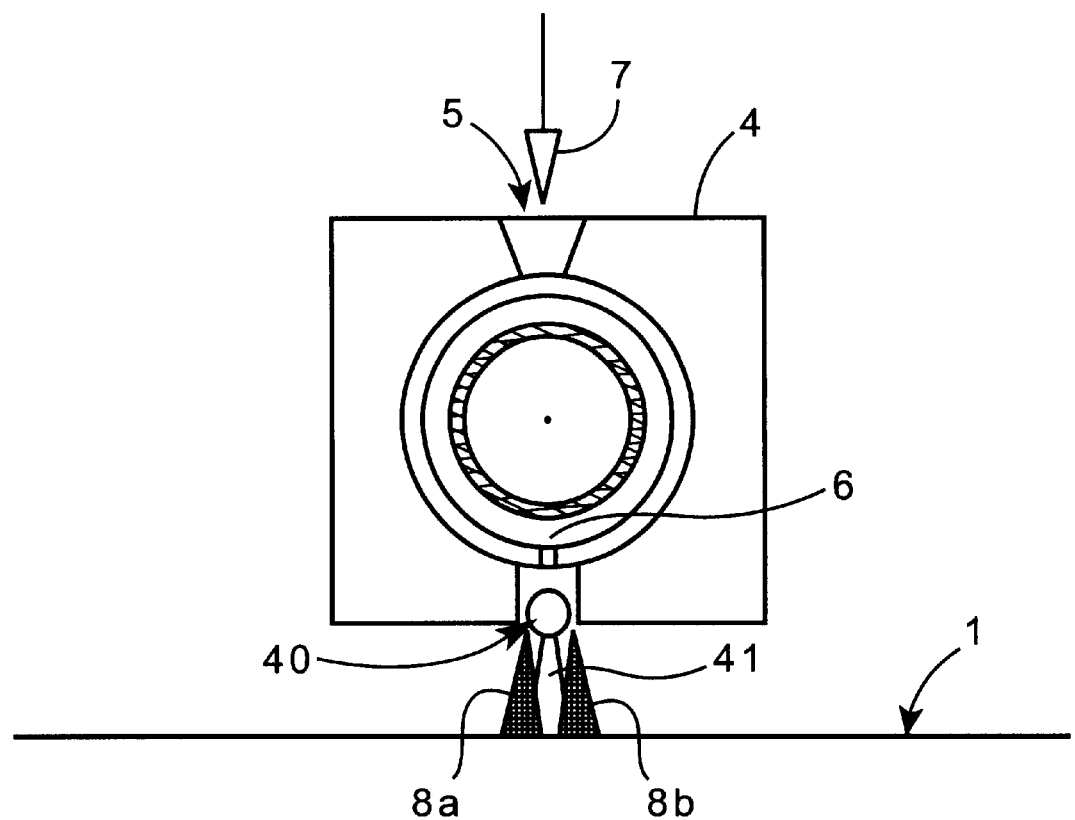
FIG. 3 is a partial schematic representation of an installation according to the invention.

FIG. 3 shows a schematic and partial representation of a device for forming a coating on a substrate suitable for implementing the process according to the present invention.

This FIG. 3 shows an apparatus 4 for forming excited or unstable species provided with its gas inlet 5, capable of admitting the initial gas mixture 7 that has to be transformed in the apparatus, and with a gas outlet 6 capable of producing the primary gas treatment mixture which includes the excited or unstable gaseous species.

As will be more clearly seen below in the context of FIG. 4, the installation is also equipped with means capable of separating the stream of primary gas mixture from the gas outlet of the apparatus into two separate streams, the means comprising here a cylindrical component 40 provided with a slot 42 over all or part of the length of the component 40.

Figure 4:
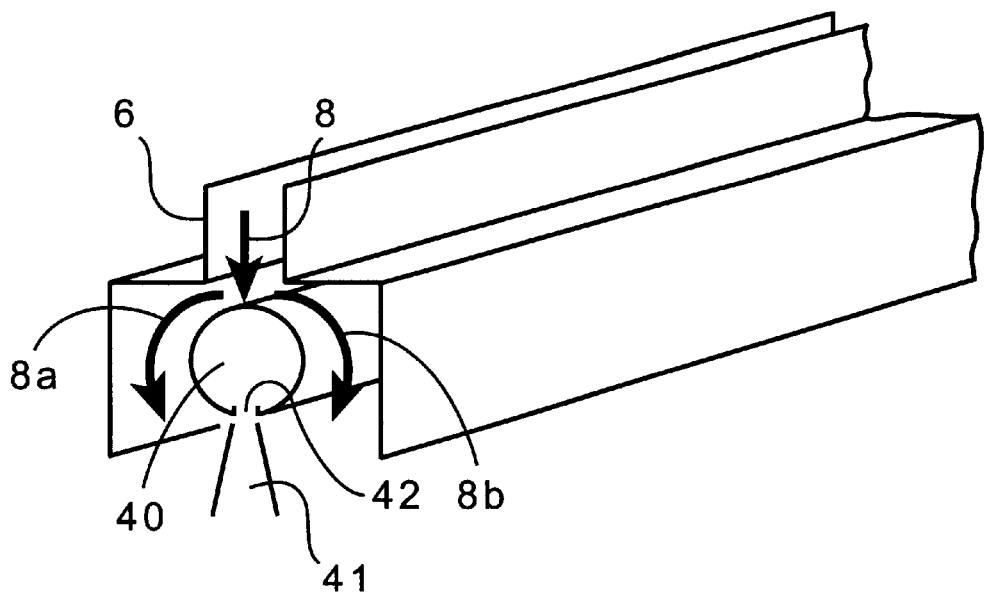
FIG. 4 is a partial detailed view of the means present in FIG. 3 for separating the stream of primary gas mixture output by the apparatus into two separate streams and for injecting the adjacent gas mixture between these separate streams of primary gas mixture.

As may be very clearly seen in FIGS. 3 and 4, the stream of primary gas mixture from the gas outlet 6 of the apparatus is therefore in fact divided into two separate streams 8a and 8b, whereas an adjacent gas treatment mixture, which includes at least one of the gaseous precursors needed to produce the coating on the component 1, for example a gaseous silicon precursor, again for example, an organometallic compound, escapes from the slot 42 of the component 40.

Such a configuration therefore makes it possible for this adjacent gas mixture to be injected into the stream of primary gas mixture as obtained at the gas outlet of the apparatus 4.

As will be clearly apparent to those skilled in the art, although the embodiment shown in FIG. 4 illustrates an injection of the adjacent mixture using a slot, many other methods of injection may be envisaged without departing from the scope of the present invention, such as a porous medium, a pipe with orifices (holes), multiple slot systems, etc.

It has therefore been possible to compare the effectiveness of the devices according to FIG. 1A, FIG. 1B and FIG. 3 in order to produce silicon-based coatings on specimens consisting of polished glass plates, approximately 50 mm in size, the specimen holder moving at a rate of about 10 cm/minute beneath the discharge.

For safety reasons and for ease of implementation, the adjacent gas mixture used was obtained from a bottle containing a $N_2$/1.9% $SiH_4$ mixture.

The comparative results obtained may be summarized in the following way:

a) first test series: using the device of FIG. 1A (unsymmetrical lateral injection of the adjacent mixture).

The adjacent mixture was injected through a lateral slot about 10 mm in width, located about 30 mm from the primary gas mixture jet 8 coming from the discharge.

The adjacent mixture flow rate used was about 12 liters/hour.

By means of this injection, it was therefore possible to demonstrate that silicon oxide layers could be deposited at a mean rate of about 1 Å/s, the amount of silane used with respect to the rate of deposition then being about $3.3 \times 10^{-3}$ liters of $SiH_4$ per Å.

Moreover, it was found that such an arrangement generates a not insignificant amount of silica powder, which signifies that a not insignificant part of the silane flow does not reach the region of the primary gas mixture jet because of the remoteness of the adjacent mixture injection.

b) for a second test series using the device in FIG. 1B (symmetrical lateral injections of adjacent mixture), we have therefore injected the adjacent gas mixture on each side of the discharge, at approximately 5 mm from the central jet of primary gas mixture.

The adjacent injections were made through slots approximately 0.5 mm in thickness, ensuring an ejection rate close to 3 m/s; the adjacent gas flow rate was close to 1 liter/h.

Such operating conditions have made it possible to deposit silicon oxide layers at a mean rate of about 1.2 Å/s, therefore corresponding to an amount of silane used with respect to the rate of deposition of $2.31 \times 10^{-4}$ liters of $SiH_4$ per Å.

It may therefore be seen without any difficulty that the efficiency of silane transformation, obtained by means of such a symmetrical injection, closer to the jet of primary gas mixture obtained in remote plasma mode, is approximately 15 times greater than that obtained previously within the context of the configuration of FIG. 1A;

c) third test series using the device of FIG. 3 (injection into the stream of primary mixture).

As clearly shown schematically in this FIG. 3, this third test series used a separation of the jet of primary gas mixture output by the discharge head into two, and the injection of the adjacent gas mixture comprising the gaseous silicon precursor between the two separate jets 8a and 8b.

Such a configuration therefore clearly makes it possible to trap the stream of adjacent mixture in the volume bounded by the two jets of primary gas mixture in order to facilitate the mixing and the reaction of the adjacent gas on the surface of the substrate.

In this configuration, the slot 42 for injecting the adjacent gas was decreased to about 0.25 mm in order to allow the rate of output of the reactive gas to be increased to approximately 5 to 6 m/s.

The two spaces for outputting the primary gas treatment mixture around the component 40 had a width of about 0.5 mm, making it possible to retain velocities close to 10 m/s for the two corresponding gas jets. The flow rate of adjacent gas was then close to 0.2 liters/h.

Such a configuration therefore made it possible to deposit silicon oxide layers at a rate close to 2.5 Å/s, corresponding to an amount of silane consumed with respect to the rate of deposition close this time to $2.2 \times 10^{-5}$ liters of $SiH_4$ per Å.

It may therefore be very clearly concluded that the silane transformation efficiency for such a central configuration of the adjacent gas mixture within the remote plasma is approximately 150 times greater than that obtained within the context of the first configuration according to FIG. 1A and approximately 10 times greater than the results obtained within the context of the configuration according to FIG. 1B.

It is therefore apparent how much such a configuration correspondingly improves the economic but also the qualitative aspects of the process, the amount of silica powder produced by such a configuration being markedly less than that produced by the previous configurations.

What is claimed is:

1. Process for forming a coating on a substrate, comprising the following steps:

converting an initial gas mixture in at least one apparatus for forming excited or unstable gaseous species to obtain, at a gas outlet of the apparatus, a primary gas treatment mixture which comprises excited or unstable gaseous species and which is substantially free of electrically charged species;

contacting the substrate at a pressure close to atmospheric pressure, with a gaseous treatment atmosphere to deposit the coating, the gaseous treatment atmosphere comprising said primary gas treatment mixture and an adjacent gas treatment mixture which comprises at least one gaseous precursor needed to form the desired coating, and which has not passed through said apparatus;

wherein the adjacent gas treatment mixture is injected within the stream of primary gas mixture obtained at the gas outlet of the apparatus.

2. Process according to claim 1, wherein injection of the adjacent gas mixture into the stream of primary gas mixture comprises:

separating the stream of primary gas mixture obtained at the gas outlet of the apparatus into at least two separate streams; and injecting the adjacent gas mixture between said at least two separate streams of the primary gas mixture.

3. Process according to claim 2, wherein the residual oxygen content in the gaseous treatment atmosphere is less than 500 ppm.

4. Process according to claim 3, wherein the residual oxygen content in the gaseous treatment atmosphere is between 5 and, 100 ppm.

5. Process according to claim 2, wherein the dew point of the gaseous treatment atmosphere is less than −20° C.

6. Process according to claim 5, wherein the dew point of the gaseous treatment atmosphere is less than −30° C.

7. Process according to claim 2, wherein during at least part of the time the substrate is in contact with the gaseous treatment atmosphere, the substrate is at a temperature of between 50 and 350° C.

8. Process according to claim 7, wherein the coating produced comprises a metal oxide or a metal oxynitride.

9. Process according to claim 8, wherein the coating produced is a film containing silicon and the adjacent gas treatment mixture includes at least one gaseous silicon precursor.

10. Process according to claim 2, wherein said at least one apparatus in which the initial gas treatment mixture is transformed, is the site of an electrical discharge created between a first electrode and a second electrode which extend in an elongated main direction, the initial gas mixture passing through the discharge transversely to the electrodes and to the main direction.

11. Process according to claim 10, wherein a layer of a dielectric is placed on the surface of at least one of the electrodes, opposite the other electrode.

12. Process according to claim 1, wherein residual oxygen content in the gaseous treatment atmosphere is less than 500 ppm.

13. Process according to claim 12, wherein the residual oxygen content in the gaseous treatment atmosphere is between 5 and 100 ppm.

14. Process according to claim 1, wherein the dew point of the gaseous treatment atmosphere is less than −20° C.

15. Process according to claim 14, wherein the dew point of the gaseous treatment atmosphere is less than −30° C.

16. Process according to claim 1, wherein during at least part of the time the substrate is in contact with the gaseous treatment atmosphere, the substrate is at a temperature of between 50 and 350° C.

17. Process according to claim 1, wherein the coating produced comprises a metal oxide or a metal oxynitride.

18. Process according to claim 17, wherein the coating produced is a film containing silicon and the adjacent gas treatment mixture includes at least one gaseous silicon precursor.

19. Process according to claim 1, wherein said at least one apparatus in which the initial gas treatment mixture is transformed, is the site of an electrical discharge created between a first electrode and a second electrode which extend in an elongated main direction, the initial gas mixture passing through the discharge transversely to the electrodes and to the main direction.

20. Process according to claim 19, wherein a layer of a dielectric is placed on the surface of at least one of the electrodes, opposite the other electrode.

21. Installation for forming a coating on a substrate, comprising:

at least one apparatus having means for converting an initial gas treatment mixture into a primary gas treatment mixture which comprises excited or unstable gaseous species and which is substantially free of electrically charged species, and a gas outlet means to discharge said primary gas treatment mixture;

means for feeding an adjacent gas treatment mixture, comprising at least one gaseous precursor needed to form the coating, which adjacent gas mixture does not pass through said at least one apparatus, to form with the primary gas mixture obtained at the gas outlet means of the apparatus, a gaseous treatment atmosphere which is brought into contact, at a pressure close to atmospheric pressure, with the substrate to produce the coating; and means for directing said feed of adjacent gas mixture within the stream of primary gas mixture obtained at the gas outlet means of the apparatus.

22. Installation according to claim 21, wherein said means for directing the adjacent gas mixture into the stream of primary gas mixture comprise:

i) means for separating the stream of primary gas mixture obtained at the gas outlet means of the apparatus into at least two separate gas streams;

j) means for injecting the adjacent gas mixture between said at least two separate streams of primary gas mixture.

23. Installation according to claim 22, wherein said at least one apparatus having means for converting an initial gas treatment mixture, includes means for creating an electrical discharge between a first electrode and a second electrode which extend in an elongated main direction, the initial gas mixture passing through the discharge transversely to the electrodes and to the main direction.

24. Installation according to claim 23, wherein a layer of a dielectric is placed on the surface of at least one of the electrodes, opposite the other electrode.

25. Installation according to claim 21, wherein said at least one apparatus having means for converting an initial gas treatment mixture, includes means for creating an electrical discharge between a first electrode and a second electrode which extend in an elongated main direction, the initial gas mixture passing through the discharge transversely to the electrodes and to the main direction.

26. Installation according to claim 25, wherein a layer of a dielectric is placed on the surface of at least one of the electrodes, opposite the other electrode.

\* \* \* \* \*